(12) United States Patent
Pandya et al.

(10) Patent No.: US 10,566,715 B2
(45) Date of Patent: Feb. 18, 2020

(54) REDUCED NET FORCE ELECTRICAL CONNECTORS

(71) Applicant: Apple Inc., Cupertino, CA (US)

(72) Inventors: Sameer Pandya, Sunnyvale, CA (US); Makiko K. Brzezinski, San Jose, CA (US); Ryan C. Perkins, San Francisco, CA (US)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 15/935,742

(22) Filed: Mar. 26, 2018

(65) Prior Publication Data

US 2019/0103688 A1    Apr. 4, 2019

Related U.S. Application Data

(60) Provisional application No. 62/565,451, filed on Sep. 29, 2017.

(51) Int. Cl.
| | |
|---|---|
| *H05K 5/00* | (2006.01) |
| *H01R 12/70* | (2011.01) |
| *H01R 13/11* | (2006.01) |
| *G04G 17/04* | (2006.01) |
| *H01Q 1/27* | (2006.01) |
| *H01Q 1/22* | (2006.01) |
| *G04G 17/06* | (2006.01) |
| *G04G 21/04* | (2013.01) |
| *H05K 7/14* | (2006.01) |

(52) U.S. Cl.
CPC ....... *H01R 12/7076* (2013.01); *G04G 17/045* (2013.01); *G04G 17/06* (2013.01); *G04G 21/04* (2013.01); *H01Q 1/22* (2013.01); *H01Q 1/273* (2013.01); *H01R 13/111* (2013.01); *H01R 13/114* (2013.01); *H05K 5/0017* (2013.01); *H05K 7/1427* (2013.01)

(58) Field of Classification Search
None
See application file for complete search history.

(56) References Cited

U.S. PATENT DOCUMENTS

| | | |
|---|---|---|
| 3,594,698 A | 7/1971 | Anhalt |
| 5,980,290 A | 11/1999 | Meynier et al. |
| (Continued) | | |

*Primary Examiner* — Courtney L Smith
(74) *Attorney, Agent, or Firm* — Kilpatrick Townsend & Stockton LLP (57) ABSTRACT

Electronic devices are disclosed that include a housing and a display coupled to the housing by an adhesive. The display includes an antenna component. The device includes a casing coupled to the display, a circuit board positioned within the housing, a wireless communication component coupled to the circuit board. The device includes a receptacle connector coupled to the housing and an electrical contact electrically coupled to the wireless communication component. The device further includes a plug connector that electrically connects the antenna component to the wireless communication component. The plug connector includes a first portion electrically coupled to the antenna component, positioned within the casing and translatable within the casing along a first axis orthogonal to a longitudinal axis of the first portion. The plug connector includes a second portion electrically coupled to the first portion, extending into the receptacle connector and contacting the electrical contact of the receptacle connector.

18 Claims, 9 Drawing Sheets

(56) References Cited

U.S. PATENT DOCUMENTS

| | | | |
|---|---|---|---|
| 6,155,858 A | 12/2000 | Ozawa et al. | |
| 6,558,177 B2* | 5/2003 | Havener | H01R 13/6315 |
| | | | 439/246 |
| 7,609,514 B2* | 10/2009 | Doczy | G06F 1/1616 |
| | | | 312/223.1 |
| 7,914,351 B2 | 3/2011 | Balsells et al. | |
| 8,174,837 B2* | 5/2012 | Tracy | G08C 17/00 |
| | | | 361/727 |
| 2011/0053666 A1* | 3/2011 | Kang | H04M 1/02 |
| | | | 455/575.6 |
| 2015/0331446 A1* | 11/2015 | Oh | G06F 1/163 |
| | | | 361/679.03 |
| 2017/0213665 A1* | 7/2017 | Weber | H04M 1/026 |

* cited by examiner

REDUCED NET FORCE ELECTRICAL CONNECTORS

CROSS REFERENCE TO RELATED APPLICATIONS

This application claims the benefit of U.S. Provisional Application No. 62/565,451, filed Sep. 29, 2017, titled "REDUCED NET FORCE ELECTRICAL CONNECTORS", the entire contents of which is hereby incorporated by reference herein.

FIELD

The described embodiments relate generally to electronic devices. More particularly, the described embodiments relate to electrical connectors that impart a net zero or low force on an interface between two components of an electronic device.

BACKGROUND

Electronic devices are often provided with wireless communications capabilities. To satisfy consumer demand for small form factor wireless devices, manufacturers are continuing to strive to implement wireless communications circuitry such as antenna components using smaller or compact structures. As the size of such antenna components (e.g., antenna radios) are reduced or minimized, the more detrimental impedance losses may become to antenna performance. For example, using flex or cable connections for routing antenna feed signals between two components of a small form factor electronic device may not be possible as the required service loops may be too detrimental to antenna performance. Direct, rigid electrical contacts or connectors may provide the necessary performance and small form factor to route antenna feed signals between components of such an electronic device. However, force (e.g., normal, shear) from such connectors in any direction (e.g., during installation or attachment of a first component to a second component) may result in creep failure of an adhesive interface between the components. As such, there remains a need for improved electrical contacts or connectors for small form factor electronic devices, and in particular, smaller or shorter plug connectors that provide an electrical connection between two components of an electronic device while imparting a net zero or low force on an interface between the components.

SUMMARY

The present disclosure describes several improvements related to electrical contacts or connectors that impart a net zero or low force upon an interface between two components of an electronic device while maintaining an electrical connection or antenna feed between the components. Such electrical connectors can, for example, impart a net zero force or significantly reduced force on an interface between such components by counteracting a push force needed for electrical connection with a pull-back force equal or greater to the push force. In some embodiments, electrical connectors are provided that allow free translation of one or more of the components such that placement tolerances do not impart a net force on an interface between the components. In yet further embodiments, a constant electrical connection force is maintained despite relative translation or placement variations between the components. Imparting a net zero force or low force between the components can reduce or eliminate a potential for failure of adhesive interfaces sensitive to creep that join surfaces of the components together. Further, such electrical connectors can be sized accordingly for maintaining a small form factor of an electronic device they are positioned within. Additionally, such electrical connectors also provide an electrical connection between the components.

Electronic devices are disclosed that include a housing and a display mechanically coupled to the housing by an adhesive. The display includes an antenna component configured to operate as at least a portion of a wireless antenna. The device includes a casing mechanically coupled to the display, a circuit board positioned within the housing, and a wireless communication component coupled to the circuit board. The device further includes a receptacle connector mechanically coupled to the housing. The receptacle connector includes an electrical contact that is electrically coupled to the wireless communication component. The device further includes a plug connector that electrically couples the antenna component to the wireless communication component. The plug connector includes a first portion electrically coupled to the antenna component and positioned within the casing and translatable within the casing along a first axis orthogonal to a longitudinal axis of the first portion. The plug connector includes a second portion electrically coupled to the first portion and extending into the receptacle.

In some embodiments, the first portion is translatable within the casing along a second axis orthogonal to the first axis and the longitudinal axis. In certain embodiments, the second portion extends through an opening in the casing and the opening allows translation of the first portion within the casing. The first and second portions may be integrally formed. In other embodiments, the receptacle connector forms a part of the housing.

The plug connector may include a spring member positioned within the casing that exerts a normal force on a first side of the first portion in a direction opposite of a normal force exerted by a bottom surface of the casing on a second side of the first portion. In certain embodiments, the forces along the first axis and a second axis orthogonal to the first and longitudinal axes are balanced at the second portion of the plug connector when the second portion mates with the receptacle connector. In some embodiments, the longitudinal axis of the first portion is spaced apart from a longitudinal axis of the casing when the second portion mates with the receptacle connector. In yet further embodiments, the plug connector is configured to route an antenna feed signal between the display and the wireless communication component when the plug connector mates with the receptacle connector. The electronic device may be an electronic watch. The plug connector may impart a net zero force on an adhesive securing a display of the electronic watch to a housing of the electronic watch.

In other aspects of the invention, electronic devices are disclosed that include a first component. The first component includes a casing. The electronic devices include a second component that includes a receptacle connector. The electronic devices can further include a plug connector that electrically connects the first and second components. The plug connector can include a first portion positioned within the casing and translatable within the casing along a first axis orthogonal to a longitudinal axis of the first portion. The plug connector can also include a second portion extending into the receptacle connector and contacting an electrical contact of the receptacle connector.

In another aspect of the invention, an electronic device is disclosed that includes a first component and a second component. The second component includes a casing and a receptacle connector positioned within casing. The receptacle connector includes a coil spring and a guide member extending around a periphery of the coil spring. The coil spring and guide member are translatable relative to the casing along a first axis orthogonal to a longitudinal axis of the receptacle connector. The electronic device further includes a plug connector that electrically connects the first and second components. The plug connector includes a first portion coupled to the first component and a second portion extending into the receptacle connector and contacting the coil spring.

In some embodiments, the coil spring and the guide member are translatable relative to the casing along a second axis orthogonal to the first axis and the longitudinal axis of the receptacle connector. The coil spring may be translatable from a first position wherein a longitudinal axis of the coil spring is spaced apart from a longitudinal axis of the plug connector during initial placement of the plug connector into the receptacle connector to a second position wherein the longitudinal axis of the coil spring is aligned with longitudinal axis of the plug connector when the second portion mates with the receptacle connector. The coil spring may expand radially outward against the guide member as the second portion is translated into the receptacle connector. The first component may include a display and the second component is coupled to a housing of the electronic device. The display of the electronic device may be secured to the housing of the electronic device with an adhesive.

In another aspect of the invention, an electronic device is disclosed that includes a first component and a second component. The second component includes a first casing and a receptacle connector positioned within the first casing. The receptacle connector includes a coil spring positioned within a second casing that extends around a periphery of the coil spring. The receptacle connector is translatable within the first casing. The electronic device further includes a plug connector that electrically connects the first and second components. The plug connector includes a first portion coupled to the first component and a second portion extending into the receptacle connector and contacting the coil spring. The first component may include a display and the second component may be coupled to a housing.

In another aspect of the invention, an electronic device is disclosed that includes a first component and a second component. The second component includes a receptacle connector. The receptacle connector includes a coil spring positioned within a casing that extends around a periphery of the coil spring. The coil spring is translatable within the casing along first and second axes orthogonal to a longitudinal axis of the receptacle connector. The electronic device also includes a plug connector that electrically connects the first and second components. The plug connector includes a first portion coupled to the first component a second portion extending into the receptacle connector and contacting the coil spring.

Other aspects and advantages of the invention will become apparent from the following detailed description taken in conjunction with the accompanying drawings which illustrate, by way of example, the principles of the described embodiments.

DETAILED DESCRIPTION

The present disclosure describes various embodiments of electrical connectors or contacts that impart a net zero or low force on an interface (e.g., an adhesive) joining or securing two components (e.g., display and housing) of an electronic device together while maintaining a required electrical connection or antenna fee between the components.

Certain details are set forth in the following description and in FIGS. 1-8 to provide a thorough understanding of various embodiments of the present disclosure. Other details describing well-known structures and systems often associated with electronic devices, wireless communications circuitry, input-output circuitry, control circuitry, antennas, adhesives, displays, etc., however, are not set forth below to avoid unnecessarily obscuring the description of the various embodiments of the present disclosure.

Many of the details, dimensions, angles and other features shown in FIGS. 1-8 are merely illustrative of particular embodiments of the present disclosure. Accordingly, other embodiments can include other details, dimensions, angles and features without departing from the spirit or scope of the present disclosure. In addition, those of ordinary skill in the art will appreciate that further embodiments of systems described herein can be practiced without several of the details described below. Various embodiments of the present disclosure can also include structures other than those illustrated in the Figures and are expressly not limited to the structures shown in the Figures. Moreover, the various elements and features illustrated in the Figures may not be drawn to scale. In the Figures, identical reference numbers identify identical or at least generally similar elements.

Figure 1:
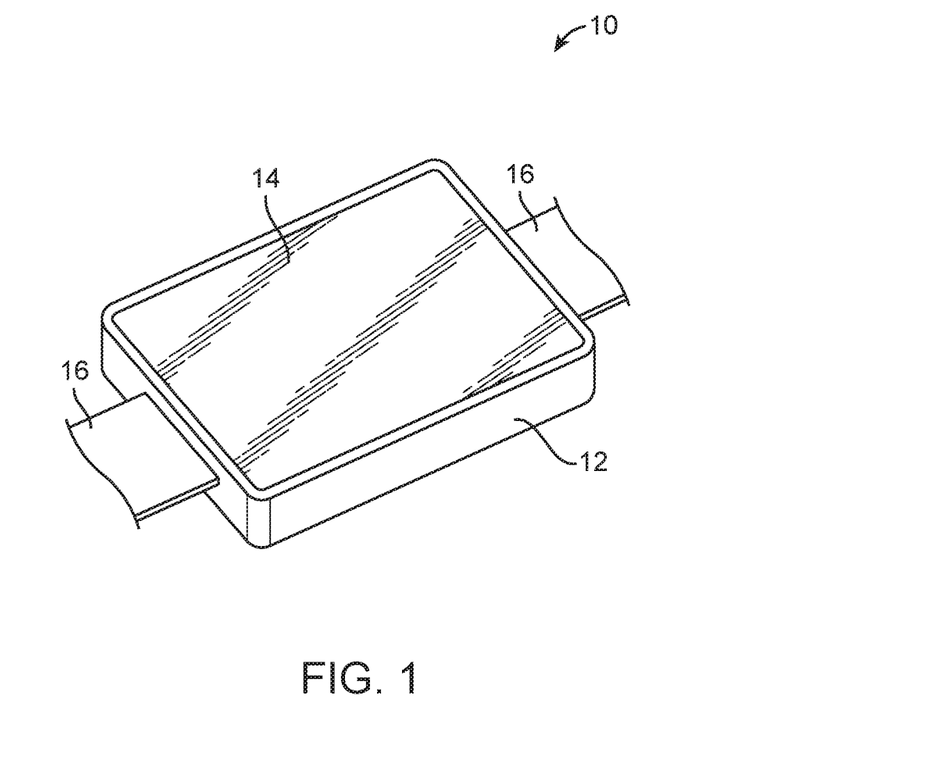
FIG. 1 shows an electronic device configured in accordance with an embodiment of the present disclosure.

An electronic device such as electronic device 10 of FIG. 1 may be provided with wireless circuitry. The wireless circuitry may include antennas or other antenna components. Antennas such as cellular telephone antennas and wireless local area network and satellite navigation system antennas may be formed from electrical components such as displays, touch sensors, near-field communications antennas, wireless power coils, peripheral antenna resonating elements, and device housing structures.

Electronic device 10 may be a computing device such as a laptop computer, a tablet computer, an electronic display, a cellular telephone, a media player, a wristwatch device, a pendant device, a headphone, an earpiece device, a device embedded in an eyeglass, a gaming device, a navigation device, a health tracking device, a fitness device, or other wearable, handheld, or portable electronic device. With reference to FIG. 1, device 10 is a portable device such as a wristwatch. In other embodiments, device 10 can be another type of electronic device.

Electronic device 10 includes a first component (e.g., a display) having a side, surface, interface, or portion attached (e.g., coupled, mounted) to a side, surface, interface, or portion of a second component (e.g., a housing) with, for example, an adhesive interface (e.g., a pressure sensitive adhesive, a heat sensitive adhesive). As described in more detail below with reference to FIGS. 2-8, some embodiments of the disclosure provide a direct, electrical connector that electrically connects the first component to the second component while imparting a net zero force or significantly reduced force on the adhesive. For example, such connectors according to embodiments of the present disclosure can reduce a force to an amount (e.g., to net zero or a significantly low force) upon the adhesive during installment, assembly, or connection of the first and second components that reduces instances of failure of the adhesive or other coupling mechanism (e.g., by tensile and/or shear creep failures). The connector can allow translation of mating portions such that placement tolerances (e.g., misalignment) do not impart a net force or significantly high force between the components (e.g., during installation, assembly, or when installed) while maintaining a constant electrical connection between the components despite translation or placement variations (e.g., misalignment) between the components.

As illustrated with respect to certain embodiments, the first component can be a display 14. The second component can be a housing 12. Display 14 is mounted in or to housing 12. Housing 12, which may be referred to as an enclosure or case, may be formed of plastic, glass, ceramic, fiber composite, metal (e.g., stainless steel, aluminum, etc.), or other suitable materials, or a combination of any two or more of these materials. Housing 12 may have metal sidewalls or sidewalls formed from other materials. Device 10 may include a strap 16. Strap 16 may be used to hold device 10 against a user's wrist. In some embodiments, strap 16 includes first and second lugs (not shown) at opposing ends of the strap and housing 12 includes first and second recesses (also not shown) on opposing sides of the housing that enable the strap to be removeably connected to the housing. Each lug can lock into one of the recesses to secure strap 16 to the housing and the housing may include a locking release mechanism that, when activated, enables the lugs to be disconnected from housing.

Display 14 may be a touch screen display that incorporates a layer of conductive capacitive touch sensor electrodes or other touch sensor components (e.g., resistive touch sensor components, acoustic touch sensor components, force-based touch sensor components, light-based touch sensor components, etc.) or may be a display that is not touch-sensitive. Display 14 may include an array of display pixels. Display 14 may also be protected by a transparent display cover, such as cover 17 shown in FIG. 2.

Figure 2:
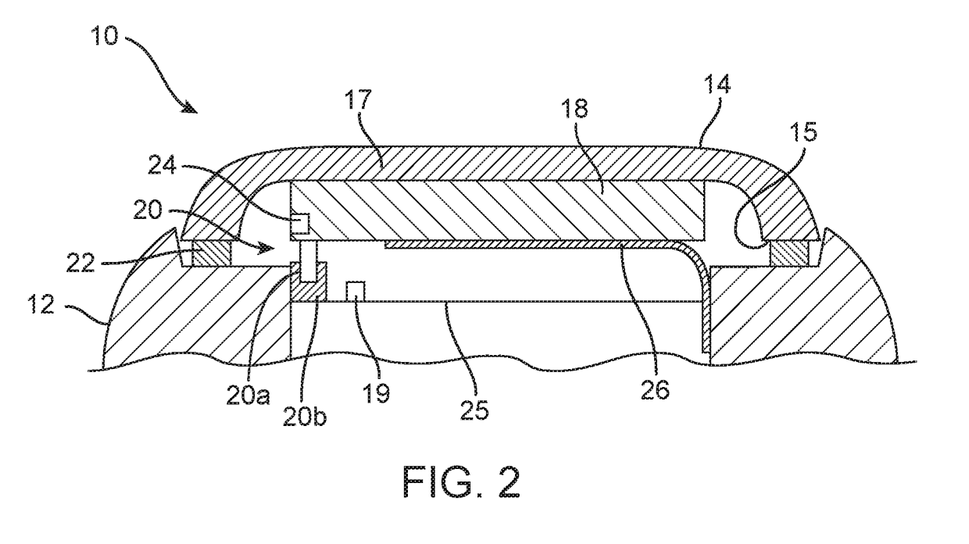
FIG. 2 shows a cross-sectional side view of the electronic device of FIG. 1 configured in accordance with an embodiment of the present disclosure.

FIG. 2 is a simplified cross-sectional side view of device 10 of FIG. 1 illustrating certain components of the device 10 and how they are positioned or connected in accordance with embodiments of the present disclosure. Display 14 can be mounted to housing 12 with an adhesive 22 or other suitable coupling mechanism. In some embodiments, display 14 has a bottom surface 15 that defines a generally rectangular shape in the in the X and Y dimensions and adhesive 22 is positioned between display 14 and housing 12 along the entire perimeter of the bottom surface. Display 14 can include one or more layers of display structures 18 under display cover 17, which can be sapphire, strengthened glass or another appropriate material. Display structures 18 can include, for example, a touch sensor display, display panel, near-field communications antenna, or other suitable circuitry. In some embodiments display structures 18 can be fused to, or otherwise bonded to, display cover 14 forming a single, attached display unit.

As discussed above, device 10 may include an antenna 24 configured to transmit or receive wireless signals along with a wireless communication chip (not shown) and other components necessary to implement wireless communication between device 10 and another electronic device (not shown). One or more components of antenna 24 may be embedded into, coupled to, or formed out of portions of a first component (e.g., the display 14) of device 10 as described in more detail below. A second component (e.g., the housing 12) of device 10 may include one or more wireless communication components 19 (e.g., a receiver, transmitter, transceiver, wireless communication chip, or other device that enables wireless communication). For example, the housing 12 may include a circuit board 25 (e.g., printed circuit board, flex circuit) positioned therein with one or more of the wireless communication components 19 coupled thereto. Signals (e.g., antenna feed) between the antenna 24 and the one or more wireless communication components 19 may be transmitted or otherwise routed via a direct, electrical connector 20. As such, wireless signals received over or transmitted by the antenna 24 may be transmitted or sent between the display 14 and the wireless communication component(s) 19 within the housing 12 by the connector 20. Device 10 can include other circuitry (e.g., printed circuits 26) to convey other signals (e.g., display data, touch sensor signals) between display 14 and housing 12 (e.g., printed circuit board 25).

Electrical connector 20 configured in accordance with embodiments described herein (e.g., as described in more detail below with reference to FIGS. 3-8) provides an electrical connection configured to route the wireless signals (e.g., antenna feed signals) transmitted or received by the antenna 24 between first and second components of an electronic device (e.g., between the housing 12 and display 14 (e.g., any of display structures 18)). For example, as discussed above, such signals may be transmitted between the display 14 (e.g., antenna 24 coupled to the display) and the housing 12 (e.g., one or more wireless communication components 19 positioned within the housing 12) via the electrical connector 20. As illustrated, the electrical connector 20 may include, for example, a first connector portion 20a coupled to the display 14 and a second connector portion 20b coupled to the housing 12. In some embodiments, first connector portion 20a is configured as a plug or pin connector and second connector portion 20b as a receptacle connector configured to receive first portion 20a. Second connector portion 20b may be mechanically coupled or secured to an inner sidewall or bottom surface of housing 12 or secured to another component positioned within housing 12 (e.g., circuit board 25). In some embodiments, second connector portion 20b may form a portion of or be integrated with housing 12. Additional features of connector 20 are described in more detail below with respect to the embodiments of FIGS. 3-8. While illustrated as routing antenna feed signals between two components, electrical connector 20 can electrically connect two components of device 10 for transmitting other signals or for other purposes (e.g., electrical grounding for high frequencies or other suitable applications that require short electrical connection paths).

Antenna 24 may be formed using any suitable antenna types. For example, antenna 24 may include antennas with resonating elements that are formed from loop antenna structures, patch antenna structures, inverted-F antenna structures, slot antenna structures, planar inverted-F antenna structures, helical antenna structures, monopole antennas, dipoles, hybrids of these designs, etc. Further, in compact or small form-factor electronic devices where space is at a premium, it may be desirable to implement antennas in device 10 using portions of electrical components that would otherwise not be used as antennas and that support additional device functions. For example, it may be desirable to induce antenna currents in components such as display 14, so that display 14 and/or other electrical components (e.g., any of display structures 18) can serve as an antenna for certain frequencies (e.g., cellular) without the need to incorporate bulky antenna structures in device 10. As described above, this may require a direct, electrical connector 20 as described herein to maintain required antenna performance and small form-factor for device 10.

Figure 3:
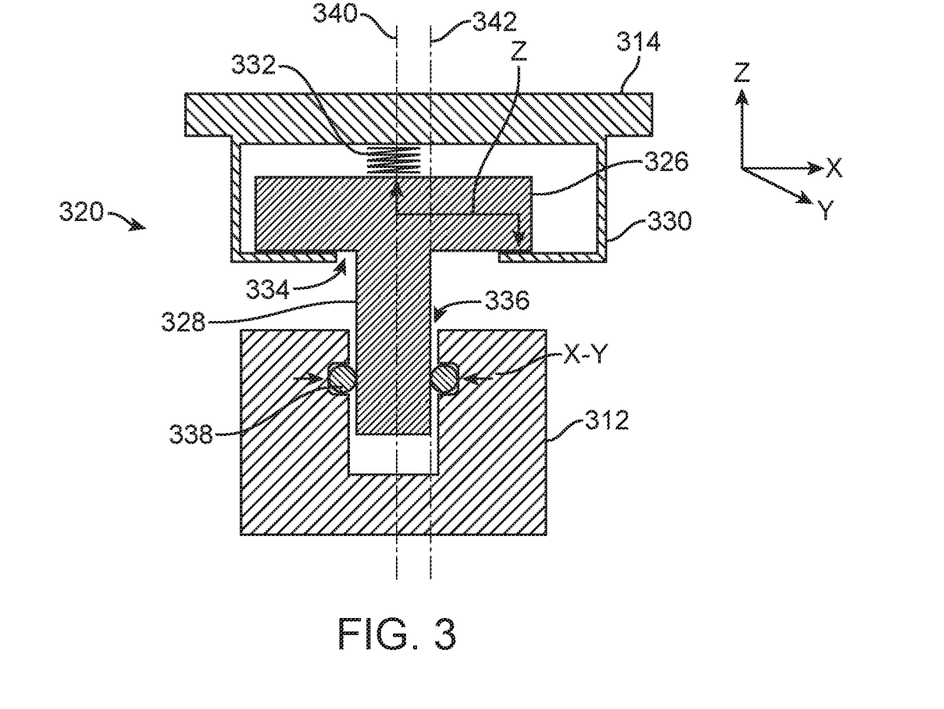
FIG. 3 shows a portion of an electronic device with an electrical connector configured in accordance with an embodiment of the present disclosure.

With reference to FIGS. 2-8, various features and configurations of electrical connector 20 and related components are illustrated that can be provided with electronic devices (e.g., electronic device 10 of FIG. 1) configured in accordance with various embodiments of the present disclosure. In some embodiments, electrical connectors (e.g., connector 20) described herein can include or be configured as a plug connector (e.g., a pin or other suitable male connector). For example, connector 10 can include a plug connector 320 as illustrated in FIG. 3. In other embodiments, the electrical connectors described herein can also include other types of suitable electrical connectors (e.g., receptacle connectors as described in more detail below). Plug connector 320 electrically connects first and second components (e.g., display and housing) of an electronic device (e.g., device 10) to, for example, route antenna feed signals between the first and second components or components coupled to the first and second components (e.g., between antenna 24 and wireless communication components 19) or to provide grounding.

Referring to FIGS. 2 and 3, first component 314 is or forms a portion of a display (e.g., display 14) of electronic device 10. Second component 312 is coupled to a housing (e.g. housing 12) or component (e.g., circuit board 25) positioned within the housing of electronic device 10. In some embodiments, the opposite may be true (e.g., first component 314 coupled to a housing and second component 312 is a display). In some embodiments, the first component 314 can be coupled to the display of an electronic device or second component 312 can form a portion of the housing of an electronic device. The second component 312 can be made from an electrically insulating material (e.g., plastic or other suitable material).

Plug connector 320 includes a first portion moveably coupled to the first component 314 (e.g., display 14). As discussed above, second component 312 is coupled to housing (e.g., housing 12) or housing component (e.g., circuit board 25) of an electronic device (e.g., electronic device 10). For example, as illustrated in FIG. 3, a first portion 326 (e.g., a head portion) of plug connector 320 is positioned or disposed within a casing 330 (e.g., a plug connector casing, shell, can, housing, frame, body) of a display 14. Plug connector 320 includes a second portion 328 (e.g., a shaft or pin portion) extending into a receptacle connector 336 (e.g., cavity, bore, hole, pocket, hollow portion) of second component 312. The second portion 328 can contact an electrical contact 338 of the receptacle connector 336 electrically coupled to a wireless communication component (e.g., one or more wireless communication components 19) as discussed in more detail below. The first and second portions 326, 328 can be made from metal or other electrically conductive material. In other embodiments, first portion 326 is coupled to second component 312 and second portion 328 is coupled to first component 314. For example, in some embodiments, first component 314 includes a receptacle connector for receiving second portion 328 and second component 312 includes a casing that first portion 326 is moveably positioned within.

Plug connector 320 can impart a net zero force or significantly reduced force at or on an interface (e.g., an adhesive interface 22) joining or securing display 14 and housing 12 together, for example, during installation or assembly of the display to the housing. In an exemplary embodiment, x, y, and z-axis forces are balanced such that there is a net zero or significantly reduced force. For example, a first portion 326 of plug connector 320 is positioned between upper and lower sides of casing 330. A spring member 332 pushes first portion 326 against lower side of casing 330 to provide a balanced z-axis or normal force (e.g., as indicated by opposing arrows Z) on plug connector 320 within casing 330. Lower side of casing 330 includes an opening 334 that second portion 328 extends through. An area of opening 334 is greater than an area of second portion 328 such that first portion 326 of plug connector 320 is unconstrained (e.g., free to translate, slide, move) along, for example, x and y-axes, within casing 330. For example, a coefficient of friction between casing 330 and first portion 326 is sufficiently low such that the first portion 326 can slide along x-axis and y-axis relative to casing 330. While first portion 326 is described herein as slidable or unconstrained along x-axis and y-axis, this includes along and/or at an angle (e.g., obliquely) to the x and y-axes (e.g., within an x-y plane).

Second portion 328 of plug connector 320 extends into receptacle connector 336 such that second portion of plug connector 320 is unconstrained along the z-axis within receptacle connector 336 (e.g., during insertion). Receptacle connector 336 can include an electrical contact such as coil 338 (e.g., a coil spring, canted coil spring, or other suitable metal spring) configured to receive and mate with second portion 328 such that x-axis and y-axis forces (e.g., as indicated by opposing arrows X-Y) are balanced on plug connector 320 within or at receptacle connector 336. Coil 338 can be retained within a groove in receptacle connector 336. Further, electrical contact or coil 338 can be electrically coupled to a wireless communication component (e.g., one or more wireless communication components 19)

Configuring plug connector 320 in such a manner balances forces (e.g., providing a net zero or significantly reduced force) at an interface joining, for example, a housing 12 and display 14 of an electronic device, during for example, installation or assembly of the first and second components 314, 312 while providing or maintaining an electrical connection between the components. Further, by allowing plug connector 320 to be unconstrained (e.g., along x, y, and/or z-axes as described above), forces are balanced or significantly reduced and electrical connection is maintained despite minor placement or translation variation or tolerances (e.g., misalignment) between portions of first component 312 and second component 314 to be joined.

For example, as illustrated, a central longitudinal axis 340 of receptacle connector 336 (e.g., or connector 320) is misaligned from a central longitudinal axis 342 of casing 330 (e.g., or opening 334). However, first portion 326 of plug connector 320 is unconstrained (e.g., along x-axis and y-axis) while forces along x-axis and y-axis at the second portion 328 are balanced such that an electrical connection can be maintained with a net zero or significantly reduced force. Similarly, second portion 328 of plug connector 320 is unconstrained (e.g., along the z-axis) as described above, while forces at the first portion 326 are balanced.

Accordingly, in some embodiments, the electronic device 10 can include a connector configured in accordance with features illustrated in FIG. 3. For example, the device 10 can include a housing 12 and a display 14 coupled to the housing 12 with an adhesive 22 as described above. Further, the display 14 includes an antenna component (e.g., antenna 24) configured to operate as at least a portion of a wireless antenna. The device includes a casing 330 mechanically coupled to the display 14 as discussed above. The device 10 further includes a circuit board 25 positioned within the housing 12 and one or more wireless communication components 19 coupled to the circuit board 25. The device 10 includes a receptacle connector 336 mechanically coupled to the housing 12. The receptacle connector 336 includes an electrical contact (e.g., coil 338). The electrical contact is electrically coupled to the wireless communication component 19 (e.g., via cable or flex). The device 10 further includes a plug connector 320 that electrically connects the antenna component to the wireless communication component 19. The plug connector 320 includes a first portion 326, as described above, electrically coupled to the antenna component and positioned within the casing 330. The portion 326 is translatable within the casing 330 along a first axis orthogonal to a longitudinal axis of the first portion 326. The plug connector 320 includes a second portion 328 electrically coupled to the first portion and extending into the receptacle connector 336 and contacting the electrical contact of the receptacle connector 336. In other embodiments, the electronic device 10 can include a connector configured in accordance with the other embodiments as described herein.

Figure 4A:
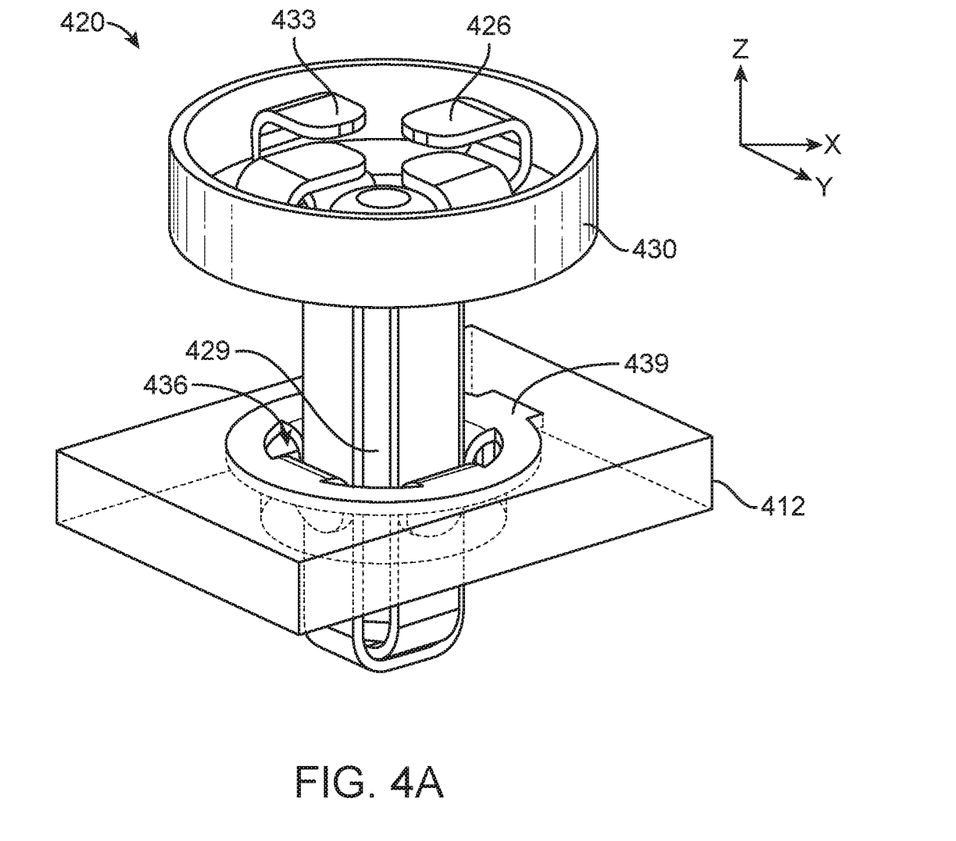
FIGS. 4A-4B shows a portion of an electronic device with an electrical connector configured in accordance with another embodiment of the present disclosure.
Figure 4B:
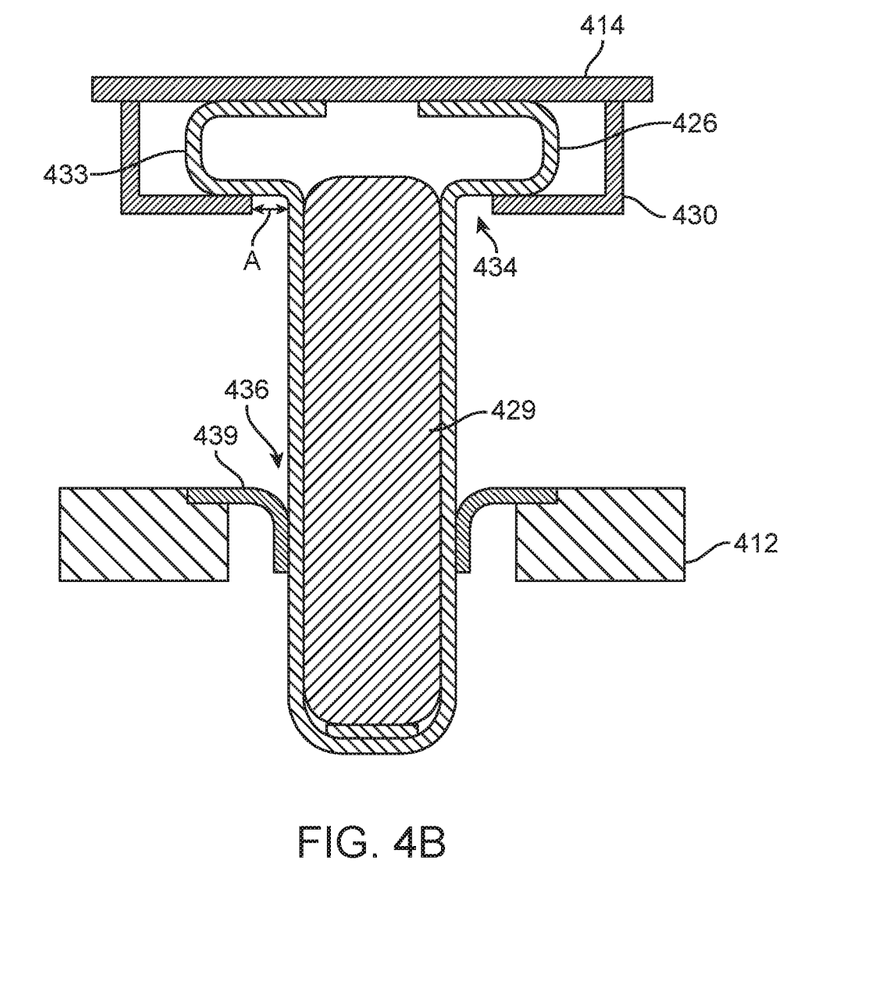

FIGS. 4A-4B illustrate a plug connector 420 configured in accordance with another embodiment of the present disclosure. Plug connector 420 is similarly configured as plug connector 320 and includes first and second portions connecting a second component 412 to a first component 414. First and second components 414, 412 may be, form a part of, or be coupled to a display or housing of an electronic device as described above with respect to first and second components 314, 312. Plug connector 420 includes a first portion 426. First portion 426 is formed out of one or more spring tabs 433 (e.g., spring fingers, stamped metal pieces) that extend around and along a stiffener portion 429 (e.g., shaft or pin body portion). Stiffener portion 429 extends away from head portion 426 towards the second end. Similar to spring 333, spring tabs 433 resiliently push or bias against opposing sides of a casing 430 such that they provide a balanced z-axis or normal force on first portion 426 of plug connector 420 within casing 430. Lower side of casing 430 includes an opening 434 that stiffener portion 429 extends through. An area of opening 434 is greater than an area of stiffener portion 429 such that first portion of plug connector 420 is unconstrained along the x-axis and y-axis (e.g., parallel and/or oblique to the x-axis and y-axis within an x-y plane) within casing 430 (e.g., as indicated by arrows A).

A second portion of plug connector 420 (e.g., stiffener portion 429) is received into a receptacle connector 436 of second component 412 such that second portion of plug connector 420 is unconstrained along the z-axis within receptacle connector 436 (e.g., during insertion). Receptacle cavity 436 can include an electrical contact or insert 439 (e.g., a coil spring, canted coil spring, molded sheet metal spring, or other suitable contact) configured to receive second portion such that x-axis and y-axis forces are balanced on second portion of plug connector 420 within receptacle connector 436. As described above with respect to plug connector 320, configuring plug connector 420 in such a manner, balances forces (e.g., imparting a net zero or significantly reduced force between first and second components of an electronic device, for example, a housing and display of an electronic device and maintains an electrical connection between the components despite minor placement or translation variation or tolerances between or when installing, for example, first component 412 to second component 414 and/or a housing to a display of an electronic device.

Figure 5A:
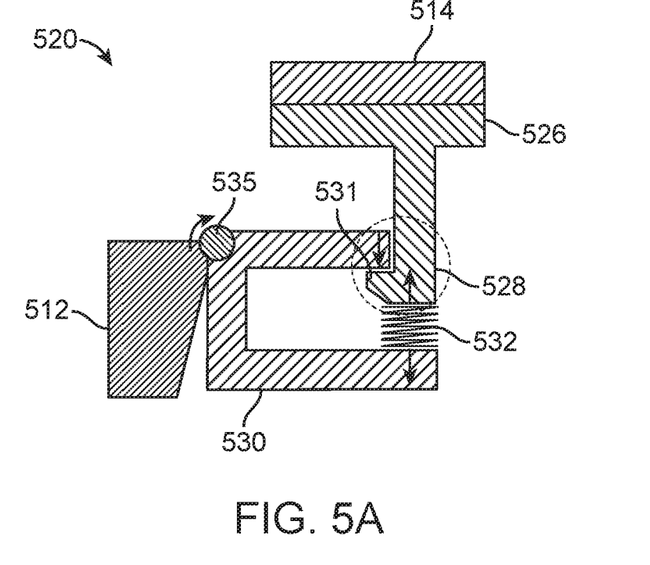
FIGS. 5A-5B shows a portion of an electronic device with an electrical connector configured in accordance with another embodiment of the present disclosure.
Figure 5B:
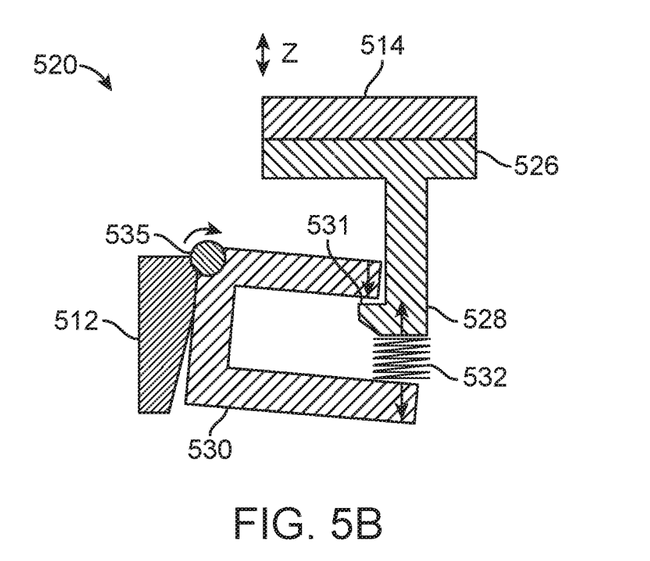

FIGS. 5A-5B illustrate a plug connector 520 configured in accordance with yet another embodiment of the present disclosure. As illustrated, plug connector 520 includes first and second portions. First portion 526 is attached to a first component of an electronic device (e.g., a display 514). Second portion 528 is positioned between upper and lower sides of a casing 530. A spring member 532 pushes second portion 528 upward against upper side of casing 530 to provide a balanced z-axis or normal force on plug connector 520 within casing 530. Balanced z-axis or normal force is illustrated by upward and downward arrows encircled in broken lines. A shoulder portion 531 is resiliently pushed upward against an upper side portion of casing 530 by spring member 532. Upper side portion of casing 530 pushes downward against shoulder portion 531 providing a balanced z-axis or normal force (e.g., net zero or significantly reduced force). Casing 530 is pivotally attached to a second component of an electronic device (e.g., a housing 512) at a fixed pivot 535 (e.g., hinge, joint) such that only forces along a z-axis are balanced in this embodiment. For example, FIG. 5B illustrates that as casing 530 pivots about pivot 535 relative to housing 512, plug connector 520 is unconstrained or can translate along or at an angle (e.g., obliquely to) the z-axis (e.g., as identified by arrows Z). Further, z-axis or normal forces are balanced (e.g., within the casing 530) such that a net zero or significantly reduced force is imparted between the first and second components (e.g., housing 512 and display 514). First and second components may form a part of or be attached to a display or housing of an electronic device as described above with respect to first and second components of FIGS. 3-4B.

FIGS. 6A-6E illustrate a plug connector 620 configured in accordance with other embodiments of the present disclosure. Plug connector 620 includes a first portion 626 (e.g., a head) attached (e.g., rigidly) to a first component 614 (e.g., a display 14) and a second portion 621 (e.g., a shaft or pin portion) attached to a second component 631 of an electronic device. The second component 631 can form a portion of, be positioned within, and/or be attached to a housing (e.g., housing 12) or component positioned within a housing of an electronic device. Second component 631 includes a casing 630 (e.g., plug casing, housing, shell, body, frame) and a receptacle connector 637 positioned within the casing 630. The casing 630 can be attached to, form a portion of, or be positioned within a housing (e.g., housing 12 of an electronics device). In other embodiments, second portion 621 is attached to the first component 614 and the first portion 626 to the second component 631.

An electrical connection between the first and second components 614, 631 (e.g., a display and housing) is provided by the plug connector 620 when second portion 621 extends into contact with the receptacle connector 637. In some embodiments, receptacle connector 637 includes a guide 623 (e.g., disc member) extending around a coil spring 625 (e.g., a canted coil spring or other suitable spring). The guide 623 and spring 625 are positioned within the casing 630. Second portion 621 of plug connector 620 is configured to be inserted through an opening 634 (e.g., in casing 630) into electrical contact with coil spring 625 to electrically connect the first and second components. FIG. 6E illustrates an embodiment of the coil spring 625 (e.g., a canted coil spring) that can be used with the plug connectors herein.

Figure 6A:
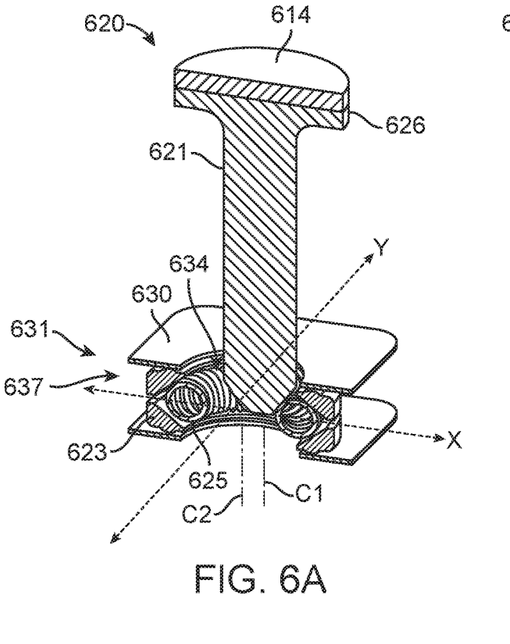
FIGS. 6A-6G shows a portion of an electronic device with an electrical connector configured in accordance with another embodiment of the present disclosure.
Figure 6B:
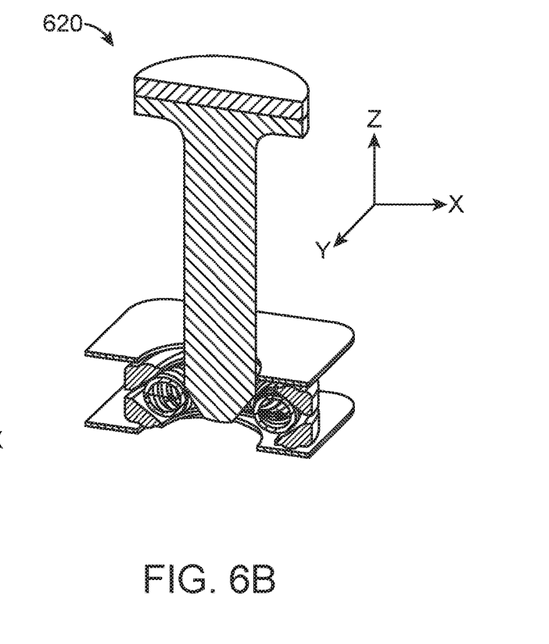
Figure 6C:
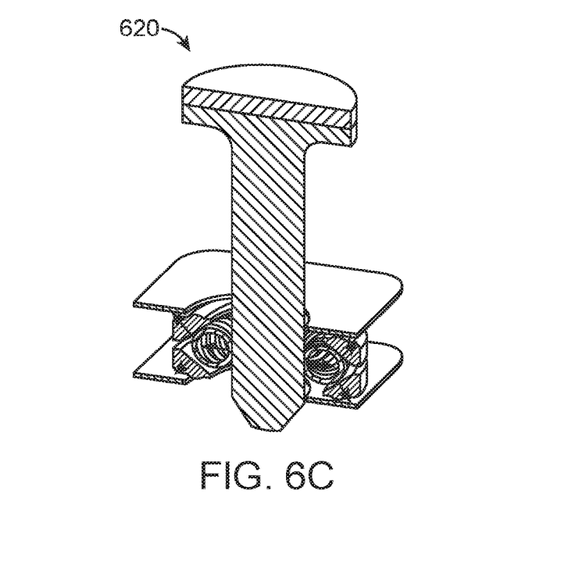
Figure 6D:
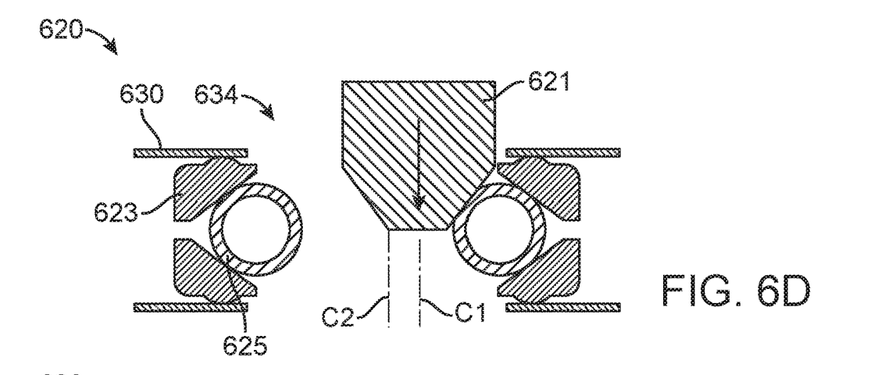
Figure 6E:
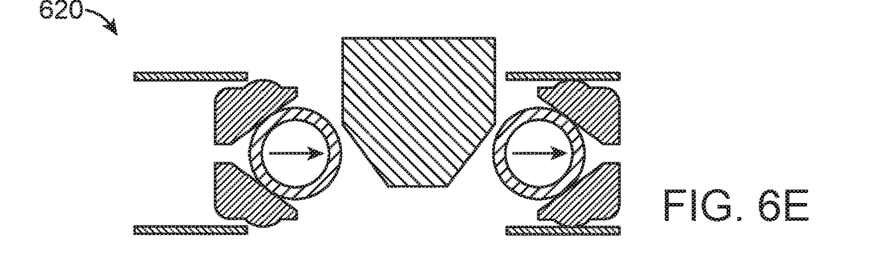
Figure 6F:
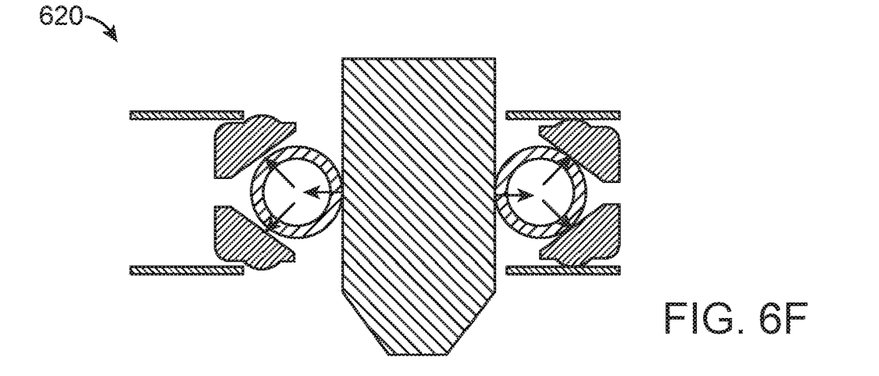
Figure 6G:
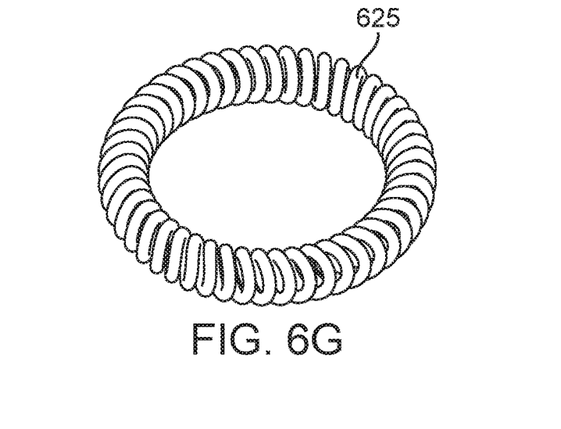

FIGS. 6A-6C show a series of views illustrating various stages of insertion of the second portion 621 of the plug connector 620 through the opening 634 and into electrical contact with the coil spring 625, and 6D-6F show a series of corresponding close-up views of the insertion of the plug connector 620 in FIGS. 6A-6C. As illustrated, there can be misalignment between second portion 621 (e.g., a central longitudinal axis C1 identified in broken lines) and opening 634 (e.g., a central longitudinal axis C2 identified in broken lines) or coil spring 625 when initially inserting second portion 621 into contact with coil spring 625 due to placement and/or translation variances or tolerances as described above. As second portion 621 is inserted further through opening 634 and into further contact with coil spring 625, it shifts (e.g., translates) spring 625 such that C1 and C2 align. Because coil spring 625 is not substantially compressed during initial insertion, such shifting or translation along an x-axis and y-axis can occur. Coil spring 625 and guide 623 are initially unconstrained within casing 630 (e.g., translatable along and/or at an oblique angle to x and y axes within an x-y plane, both axes being orthogonal to longitudinal axes C1 and C2). As second portion 621 translates or is inserted along a z-axis direction, coil spring 625 and guide 623 shift or translate (as shown by arrows in FIG. 6E) within casing 630 such that C2 aligns with C1 of second portion 621. Further translation (e.g., insertion) of second portion 621 compresses coil spring 625 and expands coil spring 625 radially outward against guide 623. Spring 625 is compressed against guide 623 until guide 623 and spring are constrained relative to casing 630. Such a configuration allows mechanical centering of the plug connector 620 even with misalignment or other variances/tolerances during installation and/or removes or reduces residual x and y stresses or forces. Net force is significantly reduced or reduced to zero. The second portion 621 is unconstrained along a z-axis (e.g., during insertion) and coil spring 625 is unconstrained along x and y-axes during initial installment until alignment and electrical connection is obtained.

Figure 7A:
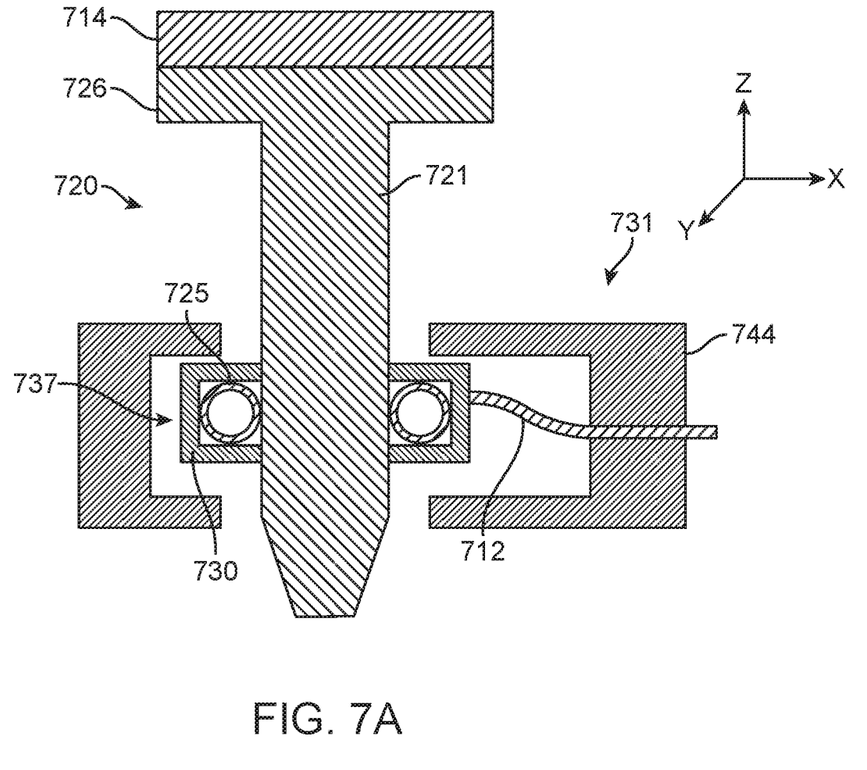
FIGS. 7A-7B shows a portion of an electronic device with an electrical connector configured in accordance with another embodiment of the present disclosure.
Figure 7B:
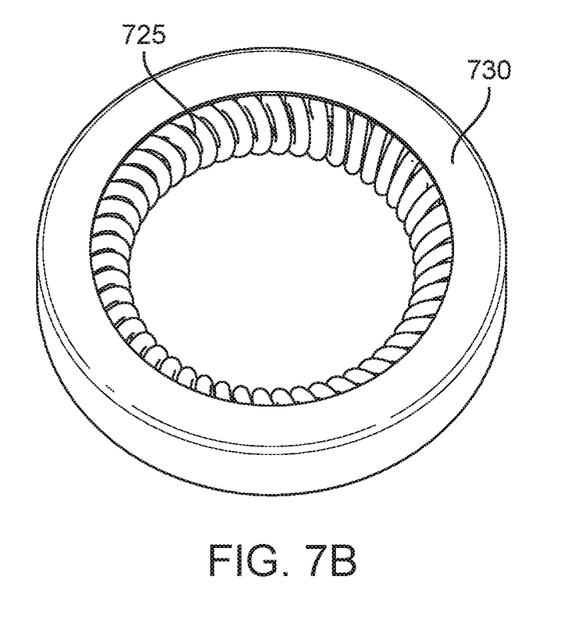

FIGS. 7A-7B illustrate another plug connector 720 configured in accordance with embodiments of the present disclosure. Similar to connector 620, plug connector 720 includes a first portion 726 (e.g. a head) which can be attached (e.g., rigidly) to a first component 714 (e.g., a display 14 of an electronic device) and a second portion 721 (e.g., a pin) extending into a receptacle connector 737 of a second component 731 (e.g., a housing 12) or attached to, for example, a housing 12. In some embodiments, second component 731 forms a portion of a housing of an electronic device. In other embodiments, second portion 721 is attached to the first component 714 and first portion 726 to the second component 731. Second component 731 can include a first casing 744 (e.g., an outer plastic casing) with the receptacle connector 737 positioned within the casing 744. The receptacle connector 737 includes a second casing 730 (e.g., a metal inner casing) extending around a coil spring 725 (e.g., as illustrated in FIG. 7B).

Coil spring 725 can be a canted coil spring or other suitable spring. Second casing 730 can "float" (e.g., is unconstrained) along and/or obliquely to x, y, and z-axes within the first outer casing 744 to reduce or minimize any residual stresses or forces during installation or assembly of the first component 714 to the second component 741. A direct electrical connection between the first and second components is provided by the plug connector 720 when second portion 721 extends into the receptacle connector 737 and into contact with the coil spring 725. As described above with respect to plug connector 620, in some embodiments, as second portion 721 is inserted into second casing 730, spring 725 can shift or translate second casing within first casing such that a central longitudinal axis of connector 720 aligns with a central longitudinal axis of the second casing or spring if the axes are initially misaligned. Further, spring 725 can push or move second casing 730 within first casing 744 as it expands. Because casing 730 is unconstrained within outer casing 744, residual stresses are removed or reduced. An antenna feed signal of antenna 712 can be routed via the electrical connection provided by the plug connector 720 between the first and second components.

Figure 8:
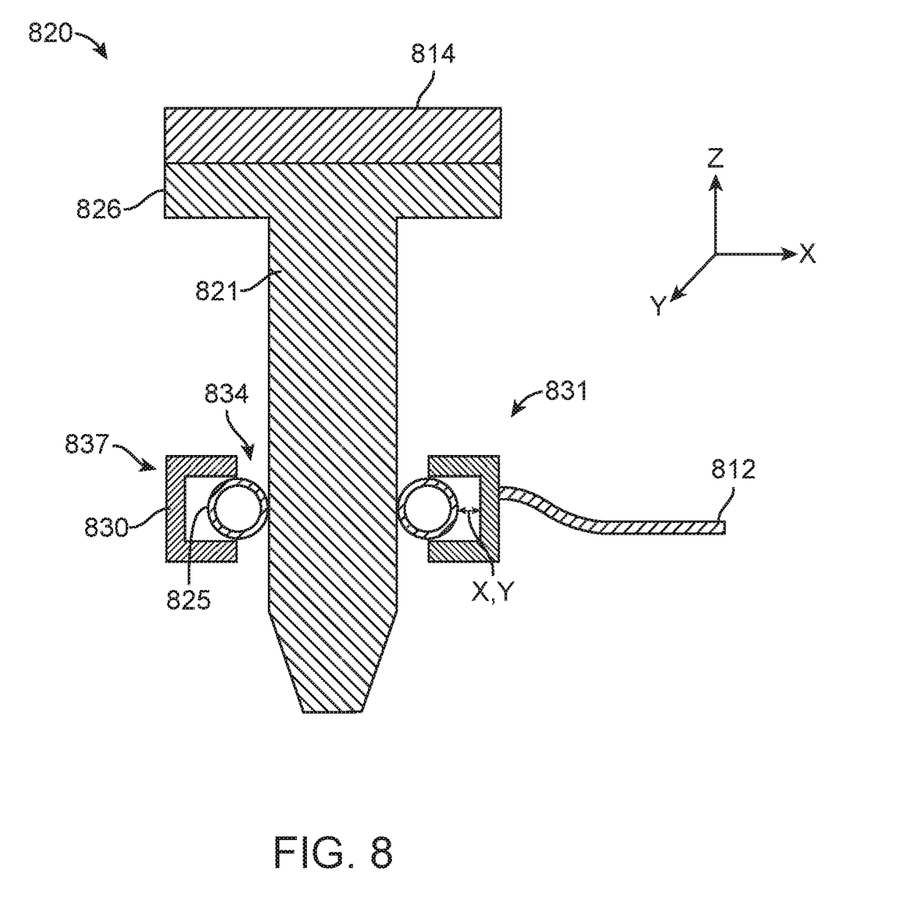
FIG. 8 shows a portion of an electronic device with an electrical connector configured in accordance with another embodiment of the present disclosure.

FIG. 8 illustrates another plug connector 820 configured in accordance with embodiments of the present disclosure. Plug connector 820 includes one or more features in whole or in part similar to plug connector 720. However, in this embodiment, plug connector 820 does not include an outer plastic casing (e.g., casing 744). Plug connector 820 includes a casing 830 (e.g., a metal casing) surrounding a coil spring 825 (e.g., a canted coil spring or other suitable spring.) In contrast to plug connector 720, the casing 830 is large enough such that coil spring 825 is unconstrained along and/or obliquely to x and y-axes within an x-y plane (e.g., as identified by arrows x,y) directly within the casing 830 to reduce residual stresses or forces during installation or assembly. In some embodiments, casing 830 forms a part of a housing or is attached to a housing of an electronic device.

From the foregoing, it will be appreciated that specific embodiments of the invention have been described herein for purposes of illustration, but that various modifications may be made without deviating from the spirit and scope of the various embodiments of the invention. Further, while various advantages associated with certain embodiments of the invention have been described above in the context of those embodiments, other embodiments may also exhibit such advantages, and not all embodiments need necessarily exhibit such advantages to fall within the scope of the invention. Accordingly, the invention is not limited, except as by the appended claims.

References throughout the foregoing description to features, advantages, or similar language do not imply that all of the features and advantages that may be realized with the present invention should be or are in any single embodiment of the invention. Rather, language referring to the features and advantages is understood to mean that a specific feature, advantage, or characteristic described in connection with an embodiment is included in at least one embodiment of the present invention. Thus, discussion of the features and advantages, and similar language, throughout this specification may, but do not necessarily, refer to the same embodiment.

Furthermore, the described features, advantages, and characteristics of the present invention may be combined in any suitable manner in one or more embodiments. One skilled in the relevant art will recognize that the present invention can be practiced without one or more of the specific features or advantages of a particular embodiment. In other instances, additional features and advantages may be recognized in certain embodiments that may not be present in all embodiments of the present invention.

Where the context permits, words in the above Detailed Description using the singular or plural number may also include the plural or singular number respectively. The word "or," in reference to a list of two or more items, covers all of the following interpretations of the word: any of the items in the list, all of the items in the list, and any combination of the items in the list.

What is claimed is:

1. A wearable electronic device comprising:
   a housing;
   a display mechanically coupled to the housing by an adhesive, the display including an antenna component configured to operate as at least a portion of a wireless antenna;
   a casing mechanically coupled to the display, the casing defining a cavity having a predetermined size;
   a circuit board positioned within the housing;
   a wireless communication component coupled to the circuit board;
   a receptacle connector mechanically coupled to the housing and having a longitudinal axis extending along a depth of the receptacle connector, the receptacle connector including an electrical contact that is electrically coupled to the wireless communication component; and
   a plug connector that electrically couples the antenna component to the wireless communication component, the plug connector comprising:
      a first portion electrically coupled to the antenna component and positioned within the casing, the first portion sized and shaped such that it is translatable within the casing along a first axis and a second axis each of which is orthogonal to the longitudinal axis of the receptacle connector; and
      a second portion extending away from and electrically coupled to the first portion and extending into the receptacle connector and contacting the electrical contact of the receptacle connector.

2. The electronic device of claim 1, wherein the second portion extends through an opening in the casing, the opening allowing translation of the first portion within the casing.

3. The electronic device of claim 1, wherein the first and second portions are integrally formed.

4. The electronic device of claim 1, wherein the receptacle connector forms a portion of the housing.

5. The electronic device of claim 1, wherein the casing comprises a spring member positioned therein configured to exert a normal force on a first side of the first portion in a direction opposite of a normal force exerted by a bottom surface of the casing on a second side of the first portion.

6. The electronic device of claim 1, wherein forces along the first axis and a second axis orthogonal to the first and longitudinal axes are balanced at the second portion of the plug connector when the second portion mates with the receptacle connector.

7. The electronic device of claim 1, wherein the longitudinal axis of the first portion is spaced apart from a longitudinal axis of the casing when the second portion mates with the receptacle connector.

8. The electronic device of claim 1, wherein the plug connector is configured to route an antenna feed signal between the display and the wireless communication component when the plug connector mates with the receptacle connector.

9. The electronic device of claim 1, wherein the wearable electronic device comprises an electronic watch.

10. The electronic device of claim 9, wherein the plug connector imparts a net zero force on the adhesive mechanically coupling the display of the electronic watch to the housing of the electronic watch.

11. An electronic device comprising:
    a first component;
    a second component that includes a casing and a receptacle connector positioned within the casing, the receptacle connector comprising:
       a coil spring;
       a guide member extending around a periphery of the coil spring, wherein the coil spring and the guide member are translatable relative to the casing along a first axis orthogonal to a longitudinal axis of the receptacle connector; and
    a plug connector that electrically connects the first and second components, the plug connector comprising:
       a first portion coupled to the first component; and
       a second portion extending into the receptacle connector and contacting the coil spring; wherein the coil spring and the guide member are translatable relative to the casing along a second axis orthogonal to the first axis and the longitudinal axis of the receptacle connector.

12. The electronic device of claim 11, wherein the coil spring is translatable from a first position wherein a longitudinal axis of the coil spring is spaced apart from a longitudinal axis of the plug connector during initial placement of the plug connector into the receptacle connector to a second position wherein the longitudinal axis of the coil spring is aligned with longitudinal axis of the plug connector when the second portion mates with the receptacle connector.

13. The electronic device of claim 12, wherein the coil spring expands radially outward against the guide member as the second portion is translated into the receptacle connector.

14. The electronic device of claim 11, wherein the first component comprises a display and the second component is coupled to a housing of the electronic device.

15. The electronic device of claim 14, wherein the display of the electronic device is secured to the housing of the electronic device with an adhesive.

16. An electronic device comprising:
    a first component;
    a second component that includes a first casing and a receptacle connector positioned within the first casing, the receptacle connector comprising:
       a coil spring positioned within a second casing that extends around a periphery of the coil spring, the receptacle connector translatable within the first casing along a first axis and a second axis each of which is orthogonal to a third axis; and a plug connector that electrically connects the first and second components, the plug connector comprising:

a first portion coupled to the first component; and a second portion extending into the receptacle connector and contacting the coil spring, the second portion having a longitudinal axis parallel with the third axis.

17. The electronic device of claim 16, wherein the first component comprises a display and the second component is coupled to a housing.

18. The electronic device of claim 17, wherein the display and housing are mechanically coupled together by an adhesive.

\* \* \* \* \*